(12) United States Patent
Seong et al.

(10) Patent No.: US 10,319,939 B2
(45) Date of Patent: Jun. 11, 2019

(54) DISPLAY APPARATUS HAVING A STRESS-REDUCTION MEMBER

(71) Applicant: Samsung Display Co., Ltd., Yongin-si, Gyeonggi-do (KR)

(72) Inventors: Juyeop Seong, Asan-si (KR); Soonryong Park, Sejong-si (KR); Jun Namkung, Asan-si (KR); Hyunkyu Choi, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 15/820,186

(22) Filed: Nov. 21, 2017

(65) Prior Publication Data
US 2018/0315951 A1    Nov. 1, 2018

(30) Foreign Application Priority Data

Apr. 26, 2017    (KR) .................... 10-2017-0053938

(51) Int. Cl.
| | |
|---|---|
| *H01L 27/32* | (2006.01) |
| *H01L 51/52* | (2006.01) |
| *H01L 51/00* | (2006.01) |
| *H01L 51/56* | (2006.01) |
| *G06F 3/041* | (2006.01) |

(52) U.S. Cl.
CPC ...... *H01L 51/5237* (2013.01); *H01L 27/3276* (2013.01); *H01L 51/0097* (2013.01); *H01L 51/56* (2013.01); *G06F 3/041* (2013.01); *G06F 2203/04102* (2013.01); *G06F 2203/04103* (2013.01); *H01L 27/323* (2013.01); *H01L 51/5281* (2013.01); *H01L 2251/5338* (2013.01)

(58) Field of Classification Search
CPC ... H01L 27/32; H01L 27/323; H01L 51/0097; H01L 2251/5338

See application file for complete search history.

(56) References Cited

U.S. PATENT DOCUMENTS

2018/0062095 A1* 3/2018 Andou .................. H01L 51/107

FOREIGN PATENT DOCUMENTS

KR    10-2013-0107883    10/2013

* cited by examiner

*Primary Examiner* — Hoai V Pham
(74) *Attorney, Agent, or Firm* — Lewis Roca Rothgerber Christie LLP

(57) ABSTRACT

A display apparatus includes a display panel including a display area in which a plurality of pixels is arranged, and a peripheral area surrounding the display area, a panel cover member covering the display area and a first area of the peripheral area adjacent to the display area and including at least one opening corresponding to the first area, and a stress-reduction member overlapping with an end area of the panel cover member which is arranged in the first area, the stress-reduction member inserted in the at least one opening and arranged in a bending area of the peripheral area in which the display panel is bent.

10 Claims, 16 Drawing Sheets

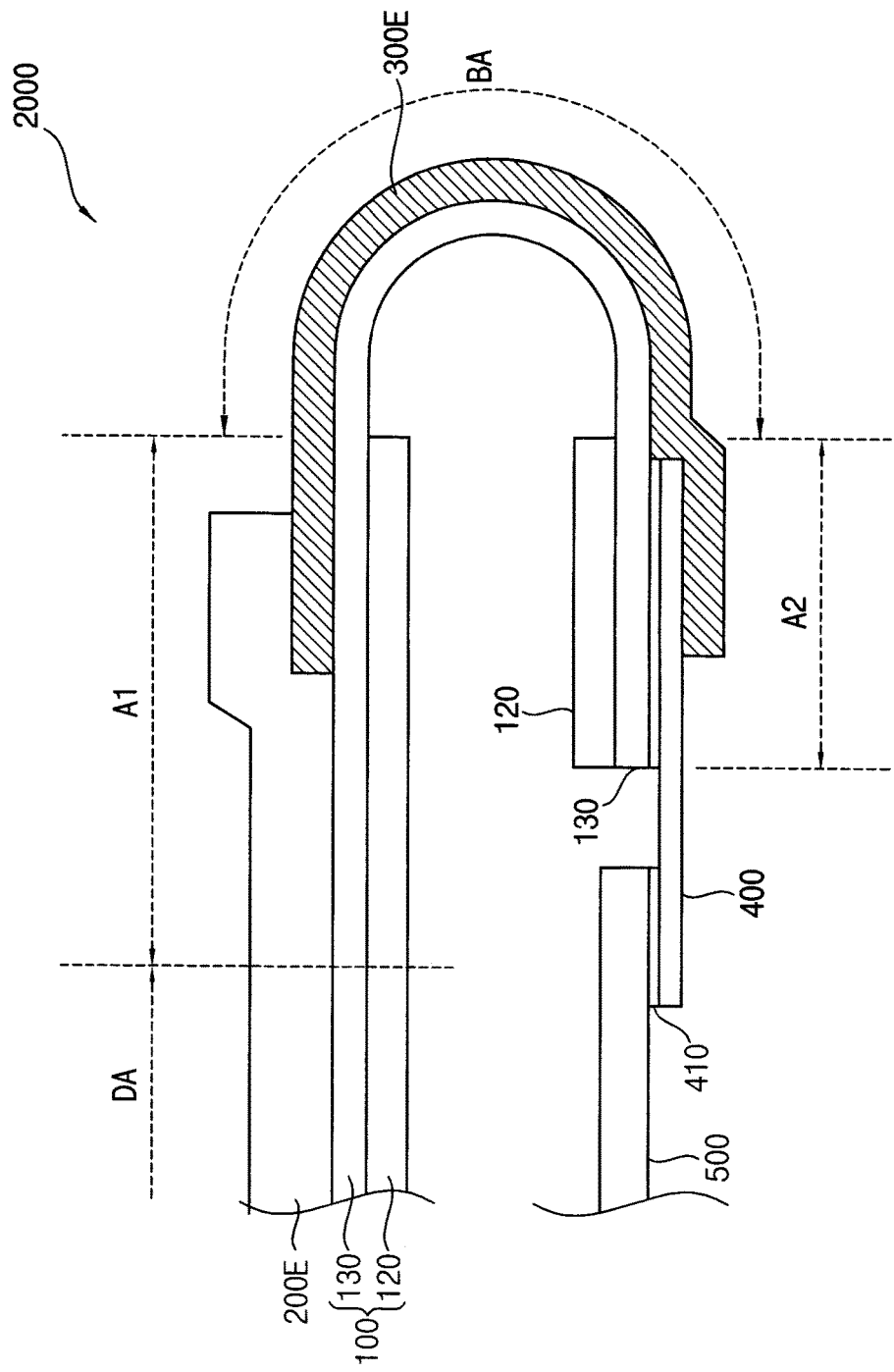

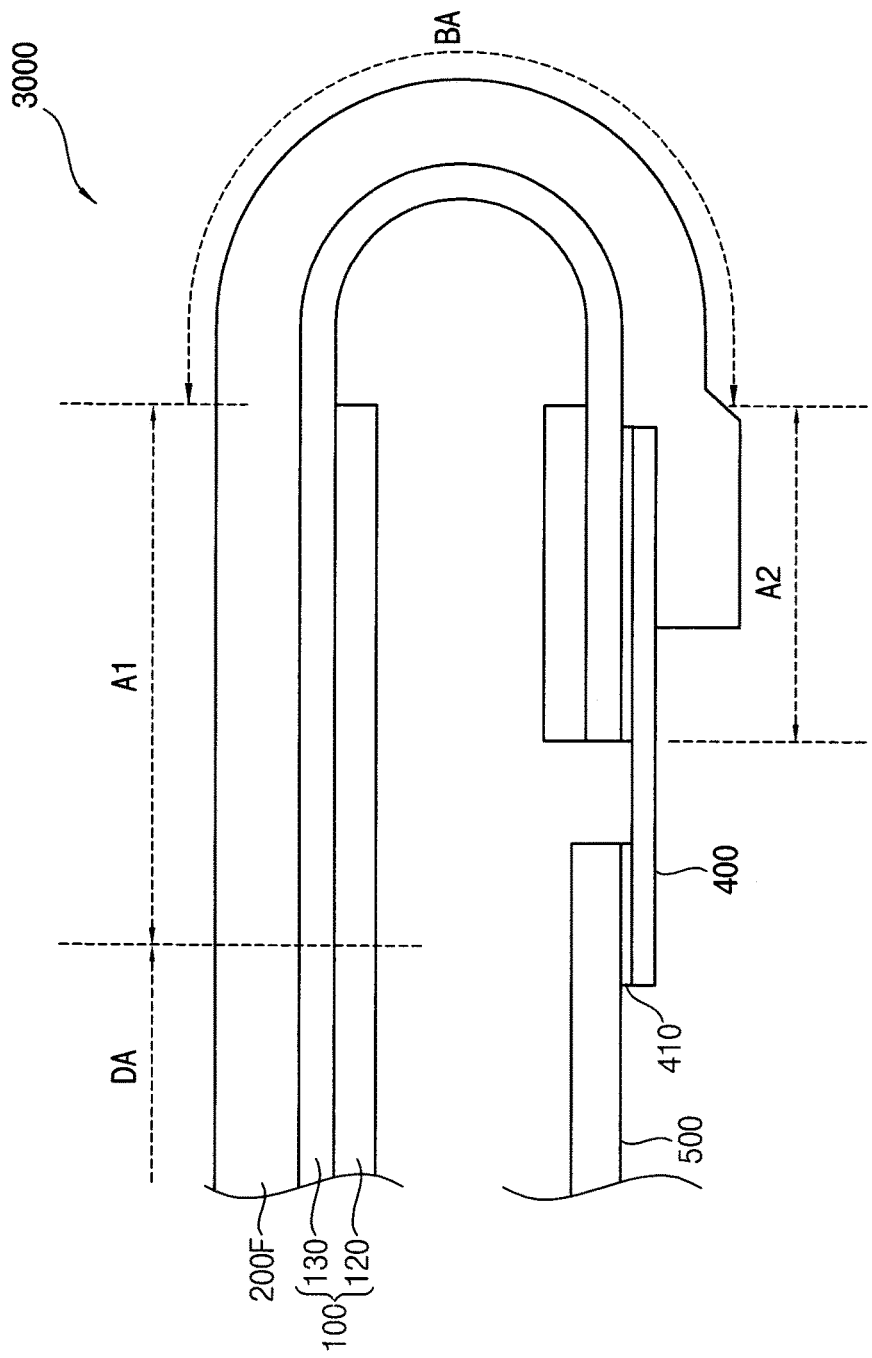

DISPLAY APPARATUS HAVING A STRESS-REDUCTION MEMBER

CROSS-REFERENCE TO RELATED APPLICATION

This application claims priority to and the benefit of Korean Patent Application No. 10-2017-0053938, filed on Apr. 26, 2017 in the Korean Intellectual Property Office, the entire content of which is hereby incorporated by reference.

BACKGROUND

1. Field

Aspects of embodiments of the inventive concept relate to a display apparatus and a method of manufacturing the display apparatus.

2. Description of the Related Art

Recently, demand for flexible display devices which are made foldable or bendable has been increasing. A flexible display device can be made to maintain a display of images while being bent similar to a sheet of paper, by using materials such as flexible plastics rather than a conventional glass substrate that lacks flexibility.

Meanwhile, among display devices, an organic light emitting display device has various advantages such as light weight, slim structure, and compactness. In some products, a touch screen panel can be attached to display device.

The flexible display device may be made to bend in a predetermined bending area and is assembled. Thus, damage such as a crack by a tensile stress may occur in the flexible display device.

SUMMARY

According to an aspect of embodiments of the inventive concept, a display apparatus having an improved outside quality and a method of manufacturing the display apparatus are provided.

Exemplary embodiments of the inventive concept, a display apparatus which can avoid damage by a bending stress of the display apparatus is provided.

According to further exemplary embodiments of the inventive concept, methods of manufacturing the display apparatus are provided.

According to one or more exemplary embodiments of the inventive concept, a display apparatus includes a display panel including a display area in which a plurality of pixels is arranged, and a peripheral area surrounding the display area, a panel cover member covering the display area and a first area of the peripheral area adjacent to the display area and including at least one opening corresponding to the first area, and a stress-reduction member overlapping with an end area of the panel cover member which is arranged in the first area, the stress-reduction member inserted in the at least one opening and arranged in a bending area of the peripheral area in which the display panel is bent.

In an exemplary embodiment, the panel cover member may include a polarizing film.

In an exemplary embodiment, the panel cover member may include a touch sensing panel.

In an exemplary embodiment, the panel cover member may include a stepped portion arranged in an end area thereof, the stepped portion defining a spacing by which the panel cover member is spaced apart from the display panel, the at least one opening may be arranged in the stepped portion of the panel cover member, and the stress-reduction member may be inserted in the spacing through the at least one opening.

In an exemplary embodiment, the display panel may include a flexible substrate layer and a pixel circuit layer which is arranged on the flexible substrate layer, the pixel circuit layer may include a plurality of transistors, a plurality of signal lines and a plurality of organic light emitting diodes, and the flexible substrate layer may be removed or not present in the bending area of the display panel.

In an exemplary embodiment, the at least one opening may include a plurality of openings arranged as a matrix type which includes a plurality of rows and a plurality of columns.

In an exemplary embodiment, the at least one opening may have a circular shape.

In an exemplary embodiment, the at least one opening may have a quadrilateral shape.

According to one or more exemplary embodiments of the inventive concept, a display apparatus includes a display panel including a display area in which a plurality of pixels is arranged, and a peripheral area surrounding the display area, a polarizing film covering the display area and a first area of the peripheral area adjacent to the display area and including at least one opening corresponding to the first area, and a stress-reduction member overlapping an end area of the polarizing film which is arranged in the first area and inserted in the at least one opening, the stress-reduction member arranged in a bending area of the peripheral area in which the display panel is bent.

According to one or more exemplary embodiments of the inventive concept, a display apparatus includes a display panel comprising a display area in which a plurality of pixels is arranged, and a peripheral area surrounding the display area; a panel cover member covering the display area and a first area of the peripheral area adjacent to the display area; and a stress-reduction member overlapping with an end area of the panel cover member which is arranged in the first area, the stress-reduction member arranged in a bending area of the peripheral area in which the display panel is bent, and the panel cover member includes a stepped portion at the end area thereof, the stepped portion defining a spacing by which the panel cover member is spaced apart from the display panel, the stress-reduction member inserted in the spacing.

According to one or more exemplary embodiments of the inventive concept, a display apparatus includes a display panel including a display area in which a plurality of pixels is arranged, and a peripheral area surrounding the display area, a flexible circuit board arranged on the peripheral area corresponding to an end portion of the display panel, and a panel cover member covering from the display area of the display panel to a partial area of the flexible circuit board arranged in the peripheral area of the display panel.

In an exemplary embodiment, the panel cover member includes a polarizing film.

According to one or more exemplary embodiments of the inventive concept, a method of manufacturing a display apparatus includes forming a display panel which includes a flexible substrate layer including a display area and a peripheral area which surrounds the display area and includes a bending area, and a pixel circuit layer which includes a plurality of transistors, a plurality of signal lines, and a plurality of organic light emitting diodes which are formed on the flexible substrate layer, adhering a panel cover member to the display area of the display panel and a first area of the peripheral area adjacent to the display area of the display panel, the panel cover member including at least one opening, coating a stress-reduction material on the first area of the display panel and the bending area of the display panel through the least one opening, and curing the stress-reduction material coated on the display panel.

In an exemplary embodiment, the method may further include removing a protection film adhered to a second surface of the display panel opposite to a first surface of the display panel on which the panel cover member is arranged, before curing the stress-reduction material, wherein the stress-reduction material remaining on the protection film corresponding to the at least one opening may be removed.

In an exemplary embodiment, the method may further include removing the flexible substrate layer in the bending area of the display panel in which the display panel is bent.

In an exemplary embodiment, the method may further include adhering a flexible circuit board to a second area corresponding to an end portion of the peripheral area using an anisotropic conductive film, wherein the stress-reduction material is coated to an end portion of the flexible circuit board arranged in the second area of the display panel.

In an exemplary embodiment, the panel cover member may include a stepped portion arranged in an end area thereof, the stepped portion defining a spacing by which the panel cover member is spaced apart from the display panel, the at least one opening is arranged in the stepped portion of the panel cover member, and the stress-reduction material is inserted in the spacing through the at least one opening.

In an exemplary embodiment, the panel cover member may include a polarizing film.

In an exemplary embodiment, the panel cover member may include a touch sensing panel.

According to one or more embodiments of the inventive concept, the end area of the panel cover member which is arranged on a side surface of the display panel may overlap with the end area of the stress-reduction member which is arranged in the bending area of the a side surface, and the tensile stress of the bending area may be reduced and damage such as a peeling interface between the display panel and the stress-reduction member may be avoided.

BRIEF DESCRIPTION OF THE DRAWINGS

The above and other features and aspects of the inventive concept will become more apparent by describing in further detail some exemplary embodiments thereof with reference to the accompanying drawings, in which:

FIG. 15 is a cross-sectional view illustrating a display apparatus according to an exemplary embodiment; and FIG. 16 is a cross-sectional view illustrating a display apparatus according to an exemplary embodiment.

DETAILED DESCRIPTION

Herein, aspects of the inventive concept will be explained in further detail with reference to the accompanying drawings.

Figure 1:
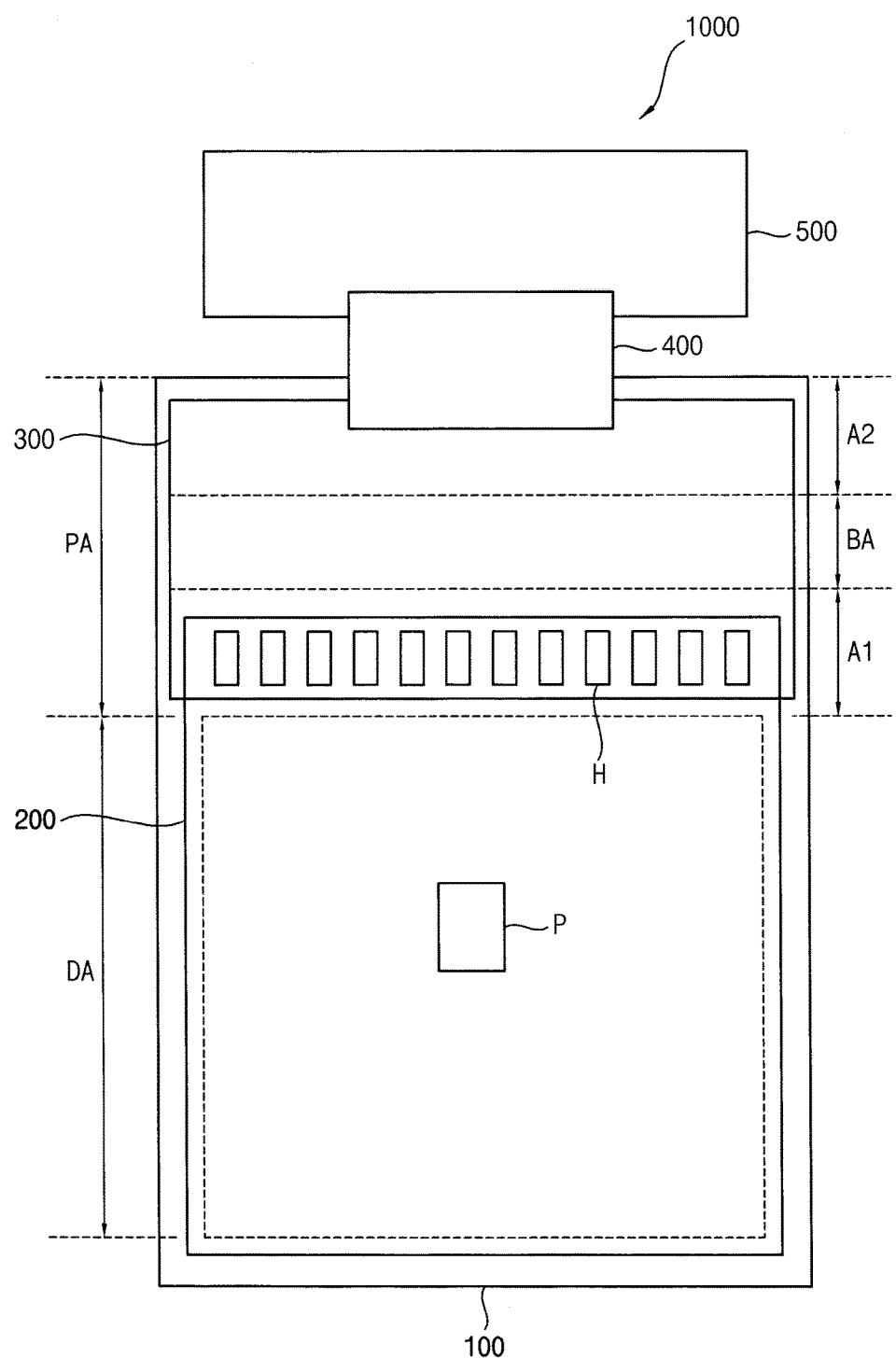
FIG. 1 is a plan view illustrating a display apparatus according to an exemplary embodiment.
Figure 2:
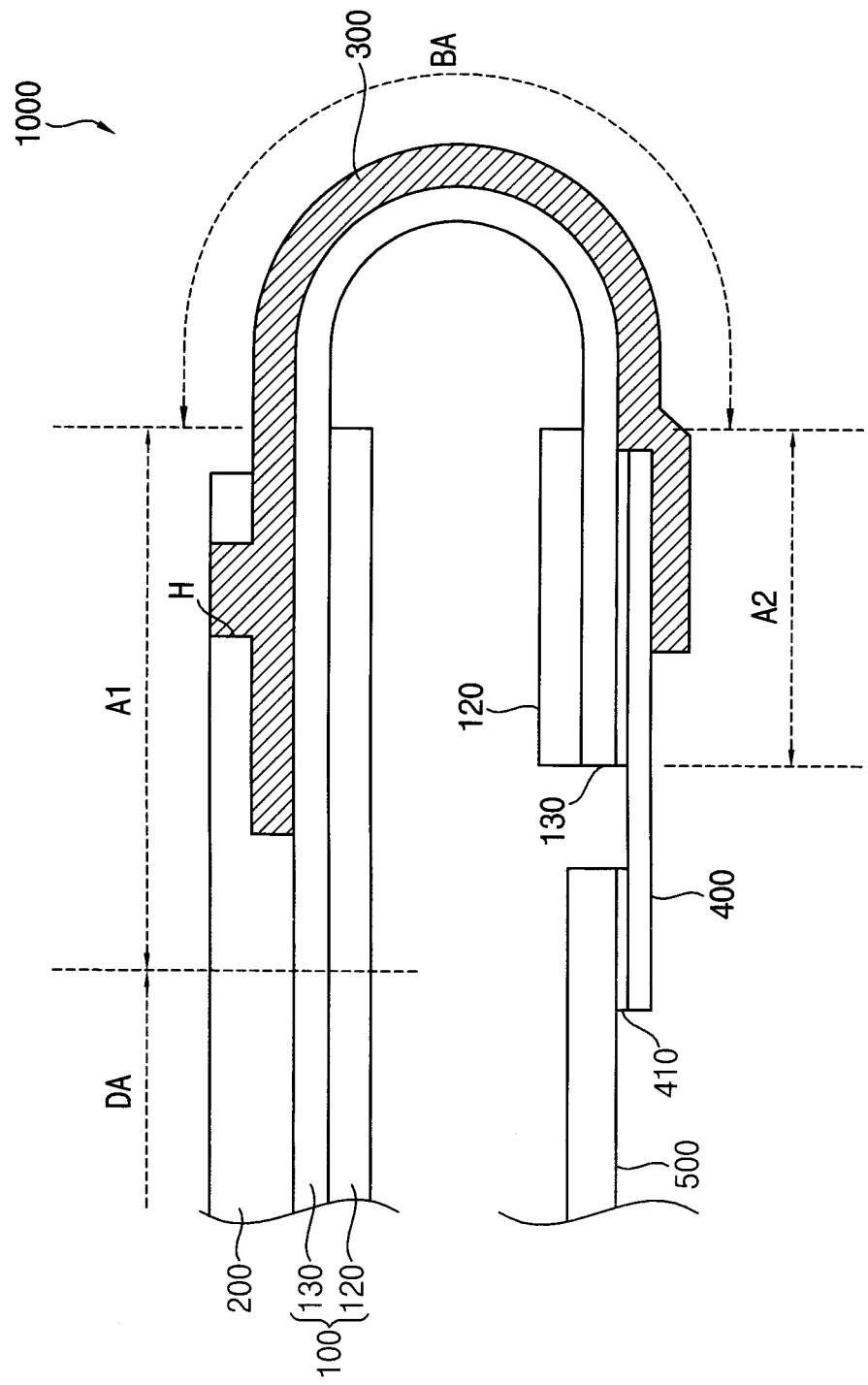
FIG. 2 is a cross-sectional view illustrating a display apparatus according to an exemplary embodiment.

FIG. 1 is a plan view illustrating a display apparatus according to an exemplary embodiment; and FIG. 2 is a cross-sectional view illustrating a display apparatus according to an exemplary embodiment.

Referring to FIGS. 1 and 2, a display apparatus 1000 may include a display panel 100, a panel cover member 200, a stress-reduction member 300, a flexible circuit board 400, and a printed circuit board 500.

The display panel 100 may include a display area DA and a peripheral area PA surrounding the display area DA in a plan view.

A plurality of pixels P may be arranged as a matrix type in the display area DA. In an embodiment, each of the plurality of pixels P may include a transistor, a capacitor, a signal line, and an organic light emitting diode.

According to an exemplary embodiment, the peripheral area PA may correspond to a side portion of the display area DA in which the flexible circuit board 400 is disposed. The peripheral area PA may include a first area A1, a second area A2, and a bending area BA.

The first area A1 may be adjacent to the side portion of the display area DA, the second area A2 may correspond to an area in which the flexible circuit board 400 is disposed, and the bending area BA may be located between the first and second areas A1 and A2.

The display panel 100 may include a flexible substrate layer 120 and a pixel circuit layer 130 in a cross-sectional view.

The flexible substrate layer 120 may be formed of a transparent material. For example, the flexible substrate layer 120 may be formed of polyimide, polyethylene naphthalate, polyethylene terephthalate, polyarylate, polycarbonate, polyetherimide, or polyethersulfone, etc.

The flexible substrate layer 120 may be removed in a partial area of the peripheral area PA. In an embodiment, for example, the flexible substrate layer 120 may be removed in the bending area BA of the display panel 100 in which the display panel 100 is bent such that a tensile stress of the display panel 100 may be reduced.

The pixel circuit layer 130 may include a circuit layer which includes a plurality of transistors, a plurality of capacitors, and a plurality of signal lines, and an organic light emitting diode (OLED) layer which includes a plurality of organic light emitting diodes on the circuit layer.

The circuit layer and the OLED layer may be disposed in the display area DA. The plurality of signal lines and a plurality of pad electrodes may be disposed in the peripheral area PA which includes the first area A1, the second area A2, and the bending area BA.

In an embodiment, the panel cover member 200 may be disposed in the display area DA and the first area A1 of the display panel 100. The panel cover member 200 may include a plurality of openings H corresponding to the first area A1.

In an embodiment, the panel cover member 200 may be a polarizing film or a touch sensing panel, but is not limited thereto. For example, the panel cover member 200 may be any of various cover members covering a side surface of the display panel 100.

The stress-reduction member 300 may be disposed in the first area A1, the bending area BA, and the second area A2 of the peripheral area PA.

In an embodiment, the stress-reduction member 300 may be formed of polyimide, polyethylene naphthalate, polyethylene terephthalate, polyarylate, polycarbonate, polyetherimide, or polyethersulfone, etc.

The stress-reduction member 300 may be disposed under the panel cover member 200 in the first area A1 of the display panel 100 and, thus, the stress-reduction member 300 may overlap with an end area of the panel cover member 200. The stress-reduction member 300 may be disposed on the display panel 100 in the bending area BA of the display panel 100. The stress-reduction member 300 may be disposed on an end area of the flexible circuit board 400 which is disposed in the second area A2 of the display panel 100.

In the first area A1 of the display panel 100, the end area of the stress-reduction member 300 may overlap with an end area of the panel cover member 200 and may be inserted in the plurality of openings H formed in the end area of the panel cover member 200. The stress-reduction member 300 may reduce a tensile stress of the display panel 100 in the bending area BA.

According to an exemplary embodiment, the stress-reduction member 300 may overlap with the end area of the panel cover member 200 and may be inserted in the plurality of openings H formed in the end area of the panel cover member 200. Thus, the tensile stress of the display panel 100 may be dispersed to the panel cover member 200. Therefore, damage such as a peeling interface between the display panel 100 and the stress-reduction member 300 may be avoided.

The flexible circuit board 400 may be disposed in the second area A2 of the display panel 100. In an embodiment, a first end area of the flexible circuit board 400 may be adhered to the second area A2 of the display panel 100 through an anisotropic conductive film (ACF) 410.

The printed circuit board 500 may be connected to the flexible circuit board 400. A second end area of the flexible circuit board 400 may be adhered to the printed circuit board 500 through the anisotropic conductive film (ACF) 410.

FIGS. 3 to 10 are cross-sectional views illustrating a method of manufacturing a display apparatus according to an exemplary embodiment.

Figure 3:
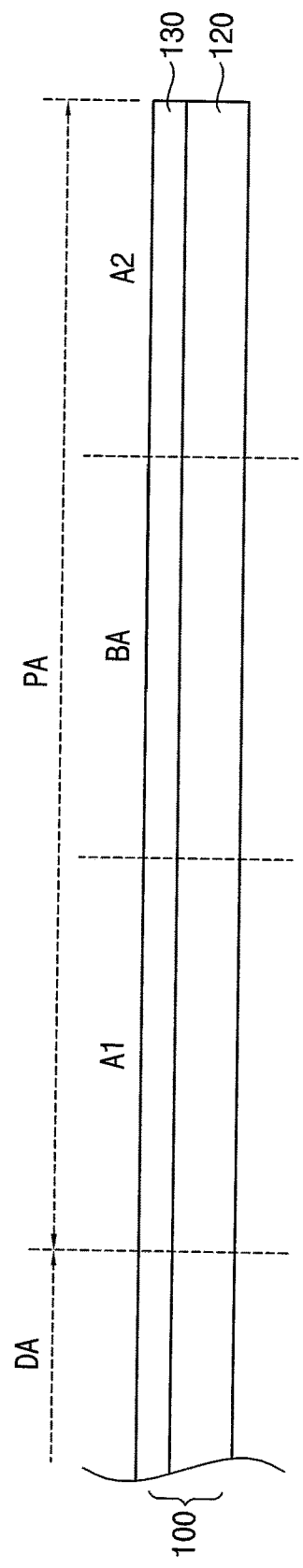
FIGS. 3 to 10 are cross-sectional views illustrating a method of manufacturing a display apparatus according to an exemplary embodiment.
Figure 4:
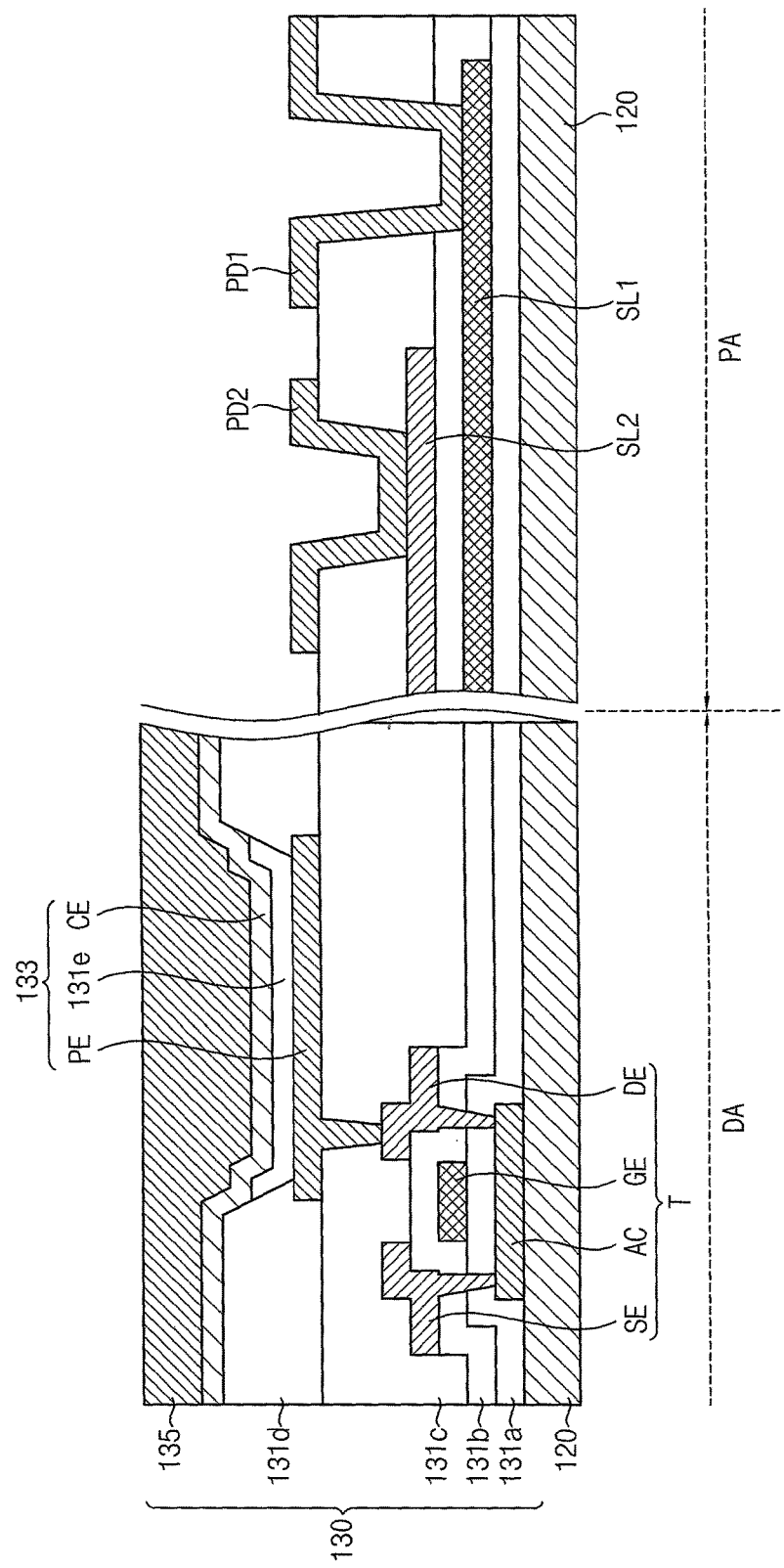

Referring to FIGS. 3 and 4, the display panel 100 may include a flexible substrate layer 120 and a pixel circuit layer 130. The pixel circuit layer 130 may be formed on the flexible substrate layer 120.

The display panel 100 may include a display area DA in which a plurality of pixels is arranged, and a peripheral area PA surrounding the display area DA. The peripheral area PA may include a first area A1 adjacent to the display area DA, a bending area BA adjacent to the first area A1, and a second area A2 adjacent to the bending area BA.

In a cross-sectional view, the display panel 100 may include the flexible substrate layer 120 and the pixel circuit layer 130 in the display area DA.

The flexible substrate layer 120 may be formed of a transparent material. In an embodiment, for example, the flexible substrate layer 120 may be formed of polyimide, polyethylene naphthalate, polyethylene terephthalate, polyarylate, polycarbonate, polyetherimide, or polyethersulfone, etc.

The pixel circuit layer 130 may include a transistor T, a pixel electrode PE, an OLED layer 133, and an encapsulation layer 135 in the display area DA.

The transistor T may include an active pattern AC, a gate electrode GE, a source electrode SE, and a drain electrode DE. A gate insulating layer 131a may be formed between the active pattern AC and the gate electrode GE. The active pattern AC may be formed of a semiconductor oxide including a binary compound (ABx), a ternary compound (ABxCy), a quaternary compound (ABxCyDz), etc. which contain indium, zinc, gallium, tin, titanium, aluminum, hafnium (Hf), zirconium (Zr), magnesium (Mg), etc. These compounds may be used alone or in combination thereof. The gate insulating layer 131a may include a silicon compound, metal oxide, etc.

An insulating interlayer 131b may be formed between the gate electrode GE and the source electrode SE. The insulating interlayer 131b may be formed between the gate electrode GE and the drain electrode DE. The insulating interlayer 131b may be formed of silicon oxide, silicon nitride, silicon oxynitride, etc. A passivation layer 131c may be formed on the transistor T. The passivation layer 131c may protect the transistor T.

The OLED layer 133 may include the pixel electrode PE, an organic light emitting layer 131e, and a common electrode CE which are formed on the passivation layer 131c.

The pixel electrode PE may be formed on the passivation layer 131c and connected to the transistor T. A pixel defining layer 131d may be formed on the passivation layer 131c on which the pixel electrode PE is formed. An opening may be formed in the pixel defining layer 131d and expose the pixel electrode PE. The organic light emitting layer 131e may be formed in an opening which exposes the pixel electrode PE. The common electrode CE may be formed on the organic light emitting layer 131e.

The encapsulation layer 135 may be formed on the common electrode CE and may include a plurality of inorganic layers or compound layers of the inorganic layer and organic layer.

In the cross-sectional view, the display panel 100 may include the flexible substrate layer 120 and the pixel circuit layer 130 in the peripheral area PA. The pixel circuit layer 130 may include a plurality of signal lines SL1 and SL2 and a plurality of pad electrodes PD1 and PD2 in the peripheral area PA.

In an embodiment, the plurality of signal lines SL1 and SL2 may include a first signal line SL1 which is formed from a conductive layer being the same as the gate electrode GE, and a second signal line SL2 which is formed from a conductive layer being the same as the source and drain electrodes SE and DE.

In an embodiment, the plurality of pad electrodes PD1 and PD2 may be formed from a conductive layer being the same as the pixel electrode PE. The plurality of pad electrodes may include a first pad electrode PD1 connected to the first signal line SL1, and a second pad electrode PD2 connected to the second signal line SL2.

Figure 5:
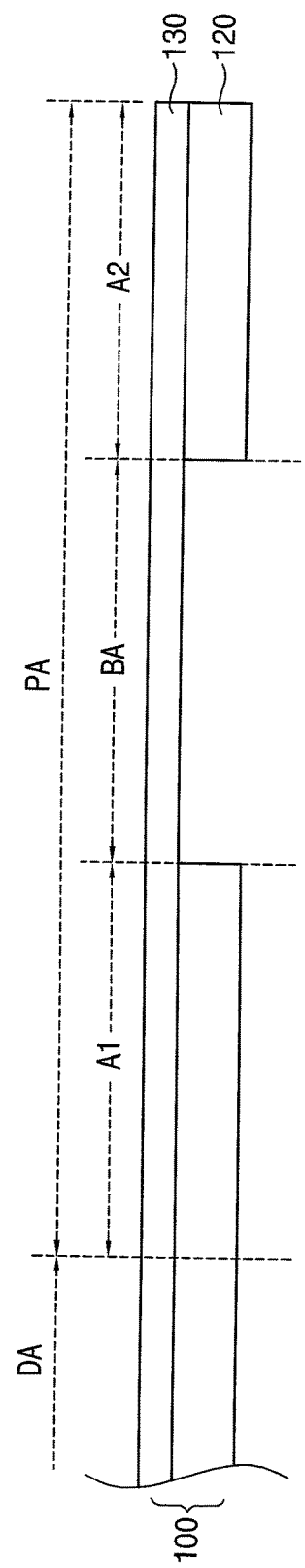

Referring to FIG. 5, in an embodiment, when the display panel 100 is completed, the flexible substrate layer 120 may be removed in the bending area BA of the display panel 100.

Figure 6:
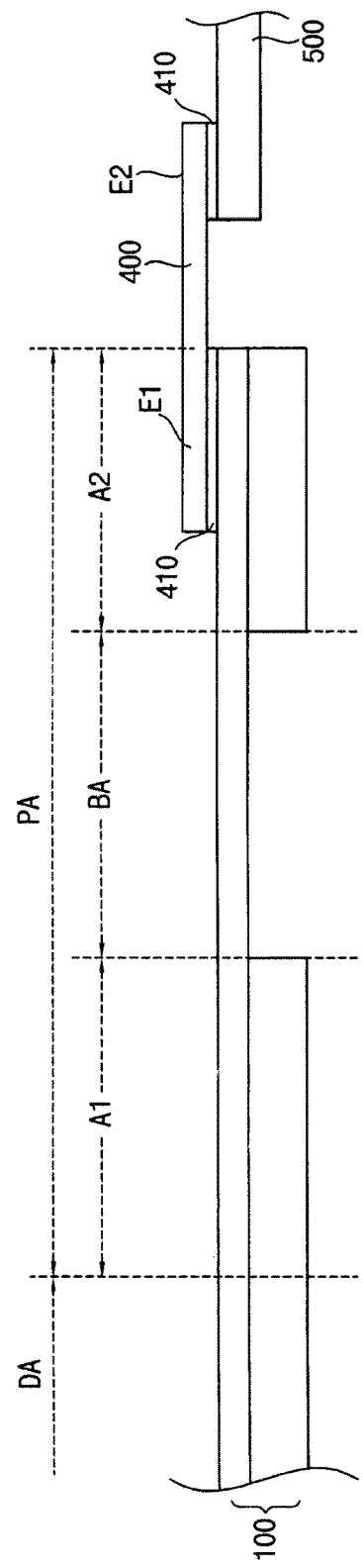

Referring to FIG. 6, a first end area E1 of the flexible circuit board 400 may be adhered to the second area A2 corresponding to an end area of the display panel 100 through an anisotropic conductive film (ACF) 410, for example. In addition, in an embodiment, a second end area E2 of the flexible circuit board 400 may be adhered to an end area of the printed circuit board 500 through the anisotropic conductive film (ACF) 410.

Figure 7:
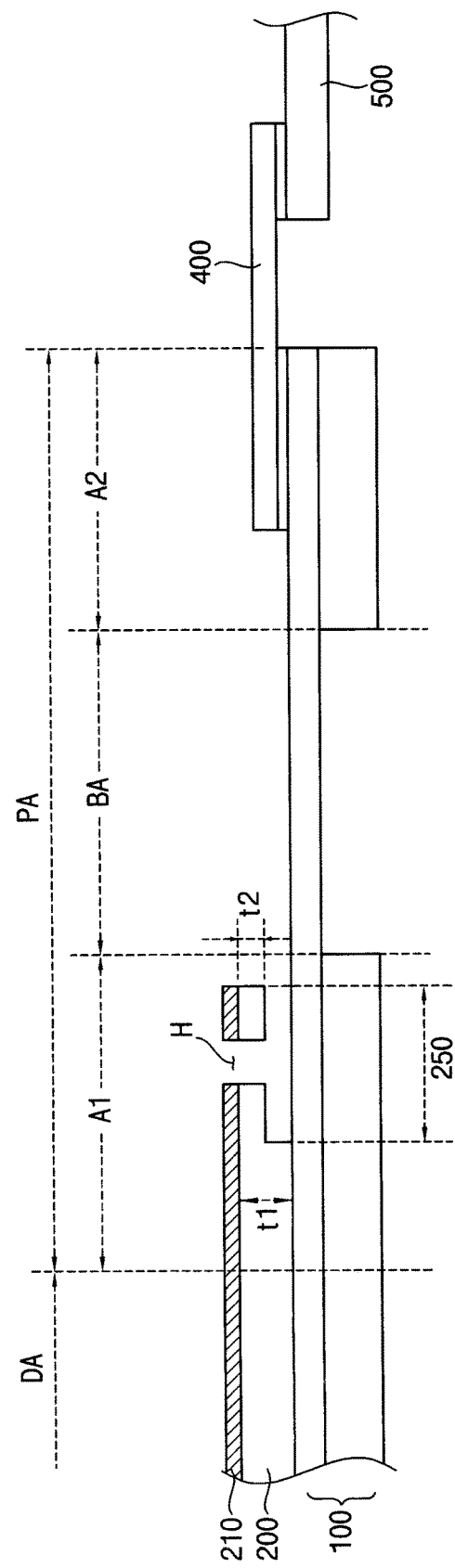

Referring to FIG. 7, a protection film 210 may be generally adhered to a first surface of the panel cover member 200. A second surface of the panel cover member 200 may be adhered to the display area DA and a first area A1 adjacent to the display area DA of the display panel 100.

As shown in FIG. 1, the panel cover member 200 may include a plurality of openings H corresponding to the first area A1 of the display panel 100.

In an embodiment, the panel cover member 200 may be a polarizing film or a touch sensing panel, but is not limited thereto. For example, the panel cover member 200 may be any of various cover members covering a side surface of the display panel 100.

As shown in FIG. 7, the panel cover member 200 may include a stepped portion 250 formed in an end area of the panel cover member 200 which is adhered to the first area A1 of the display panel 100, and the plurality of openings H may be formed in the stepped portion 250. The stepped portion 250 may have a second thickness t2 smaller than a first thickness t1 of the panel cover member 200 which is adhered to the display area DA, and may be spaced apart from a surface of the display panel 100 by a difference t1−t2 between the first and second thicknesses t1 and t2. Thus, the stepped portion 250 may define a spacing between the display panel 100 and the panel cover member 200 in the first area A1.

Figure 8:
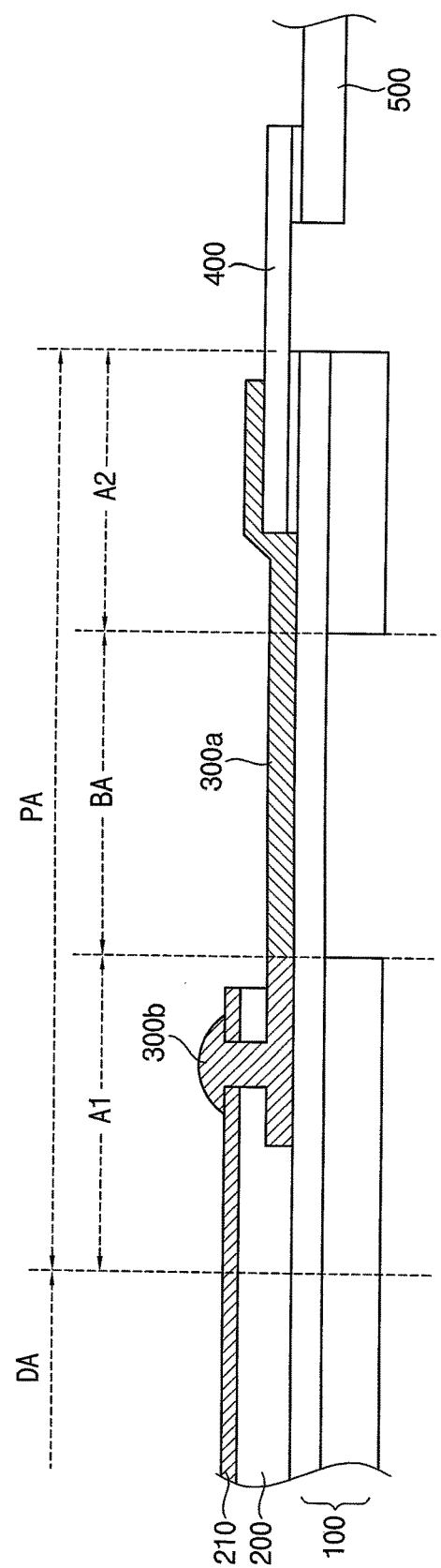

Referring to FIG. 8, a stress-reduction material 300a may be coated on the display panel 100 on which the panel cover member 200 is adhered to the display panel 100. The stress-reduction material 300a may be inserted in the spacing and the openings H through the plurality of openings H which is formed in the stepped portion 250 of the panel cover member 200. In addition, the stress-reduction material 300a may be coated on the bending area BA and the first end area E1 of the flexible circuit board 400 which is adhered to the second area A2 of the display panel 100.

Figure 9:
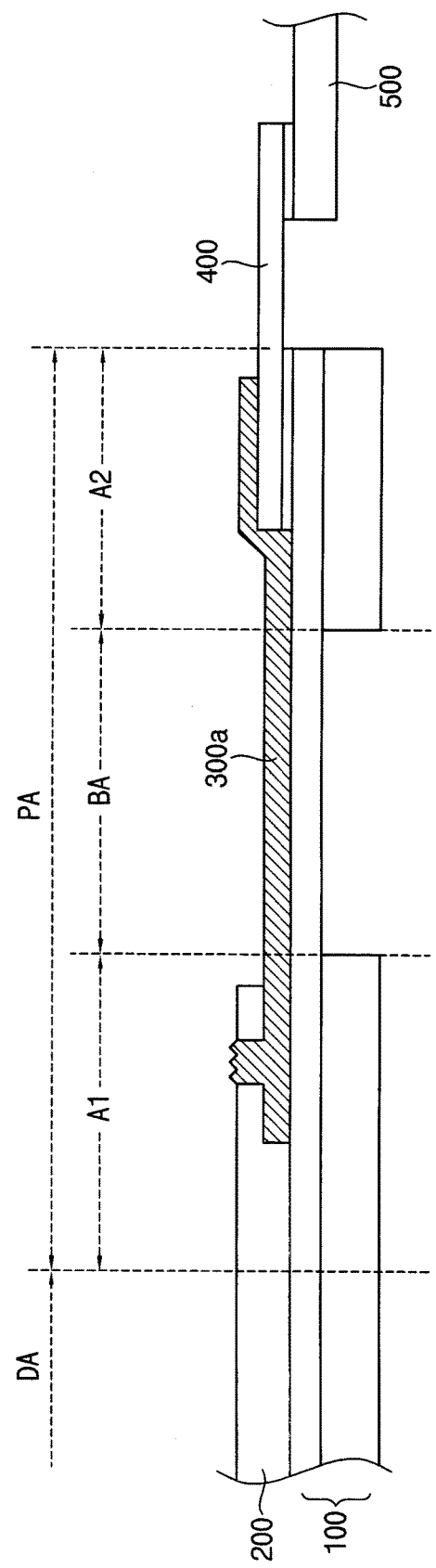

Referring to FIGS. 8 and 9, a residue 300b of the stress-reduction material 300a may remain on a surface of the protection film 210 corresponding to the plurality of openings H.

Then, the protection film 210 may be separated from the panel cover member 200. The protection film 210 is separated from the panel cover member 200 and, thus, the residue 300b of the stress-reduction material 300a remaining on the protection film 210 may be removed. Thus, further processes for removing the residue 300b may be omitted.

Figure 10:
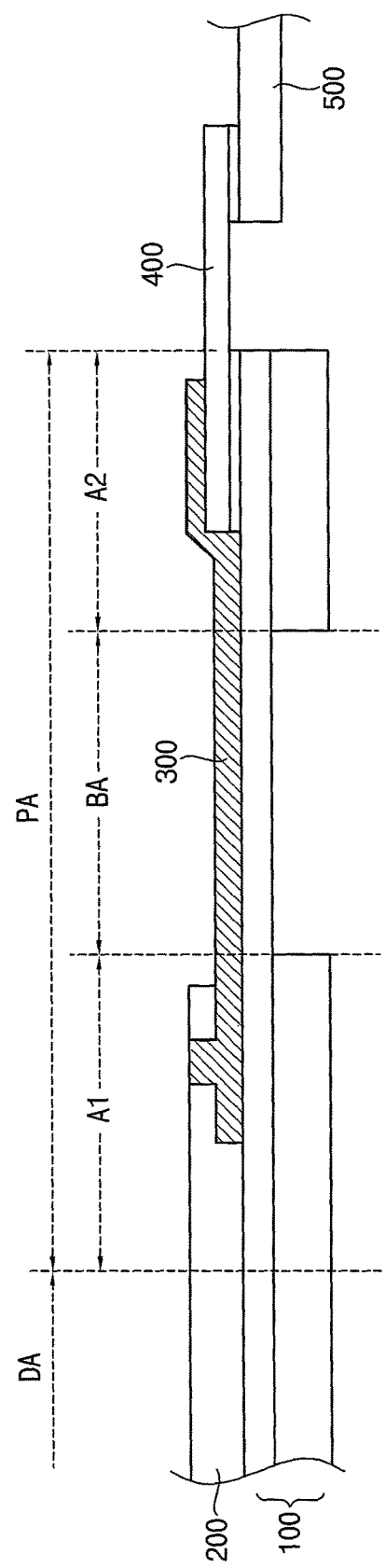

Referring to FIG. 10, the stress-reduction material 300a may be cured to form a stress-reduction member 300.

The stress-reduction member 300 may be formed of polyimide, polyethylene naphthalate, polyethylene terephthalate, polyarylate, polycarbonate, polyetherimide, or polyethersulfone, etc.

An end area of the stress-reduction member 300 may overlap with the stepped portion 250 of the panel cover member 200 and may be inserted in the plurality of openings H of the stepped portion 250.

Therefore, in assembling processes, when the display panel 100 is bent in the bending area BA, the end area of the stress-reduction member 300 may be fixed by the stepped portion 250 of the panel cover member 200 and, thus, the tensile stress of the display panel 100 may be dispersed to the panel cover member 200. Therefore, damage, such as a peeling interface between the display panel 100 and the stress-reduction member 300, may be avoided.

FIGS. 11 to 14 are plan views illustrating various panel cover members according to some exemplary embodiments.

Figure 11:
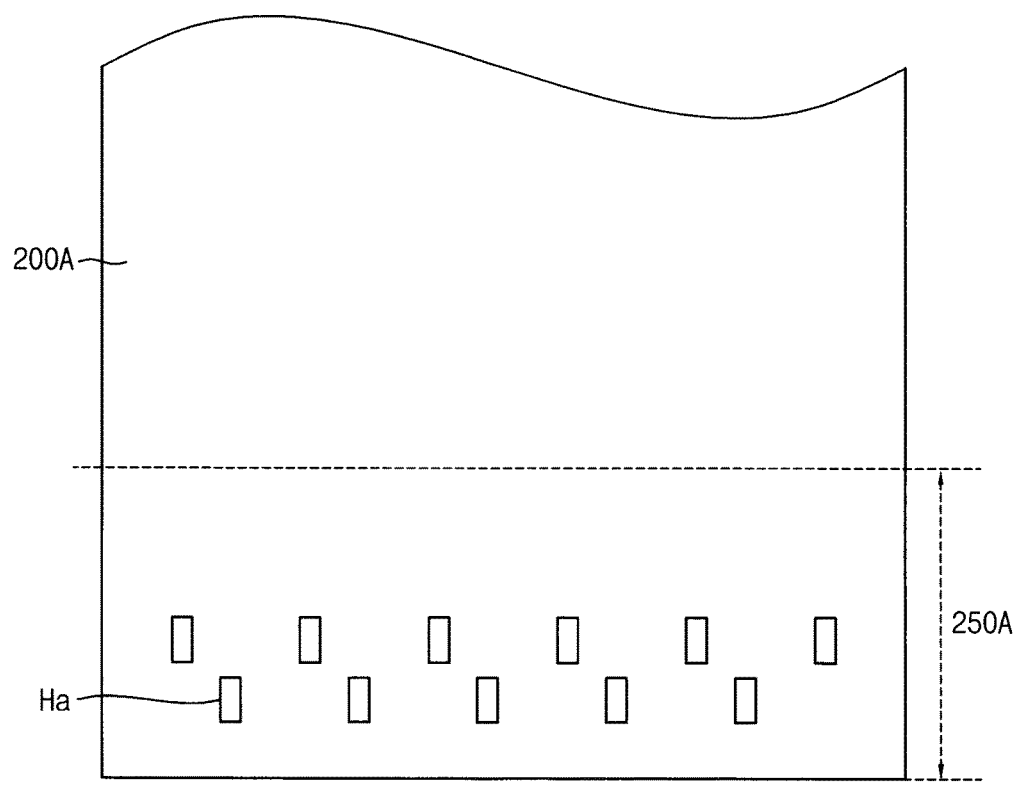
FIGS. 11 to 14 are plan views illustrating various panel cover members according to some exemplary embodiments.

Referring to FIG. 11, according to an exemplary embodiment, a panel cover member 200A may include a stepped portion 250A in an end area of the panel cover member 200A. The stepped portion 250A may include a plurality of openings Ha having a quadrilateral shape and arranged as a matrix type including a plurality of rows and a plurality of columns. For example, as shown in FIG. 11, the openings Ha may be arranged as a zig-zag type in a row direction.

Figure 12:
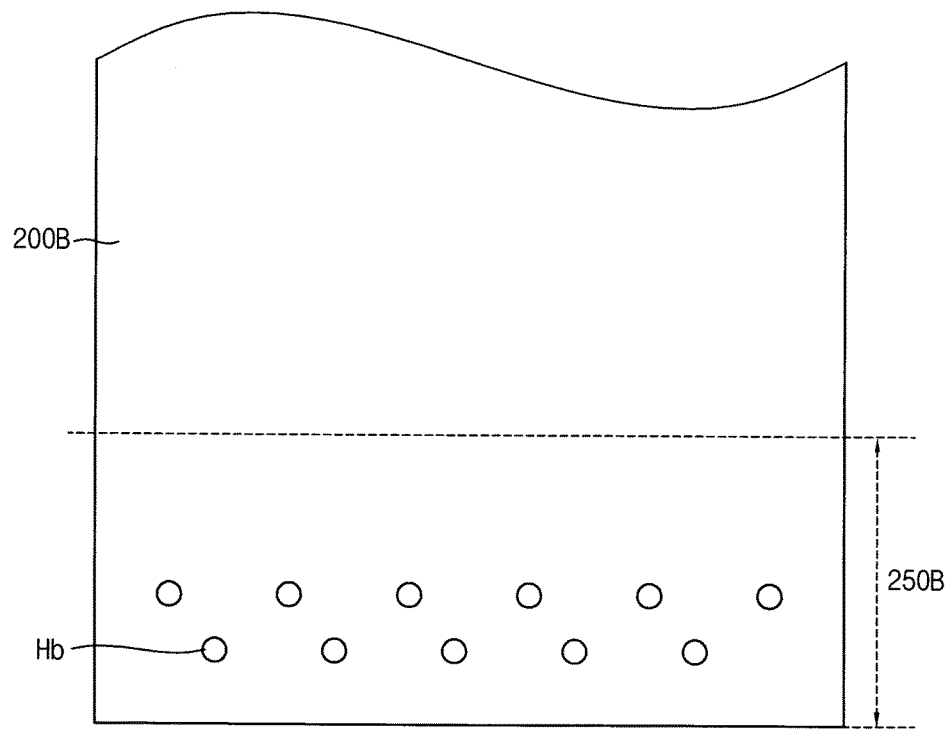

Referring to FIG. 12, according to an exemplary embodiment, a panel cover member 200B may include a stepped portion 250B in an end area of the panel cover member 200B. The stepped portion 250B may include a plurality of openings Hb having a circular shape and arranged as a matrix type including a plurality of rows and a plurality of columns. For example, as shown in FIG. 12, the openings Hb may be arranged as a zig-zag type in a row direction.

Figure 13:
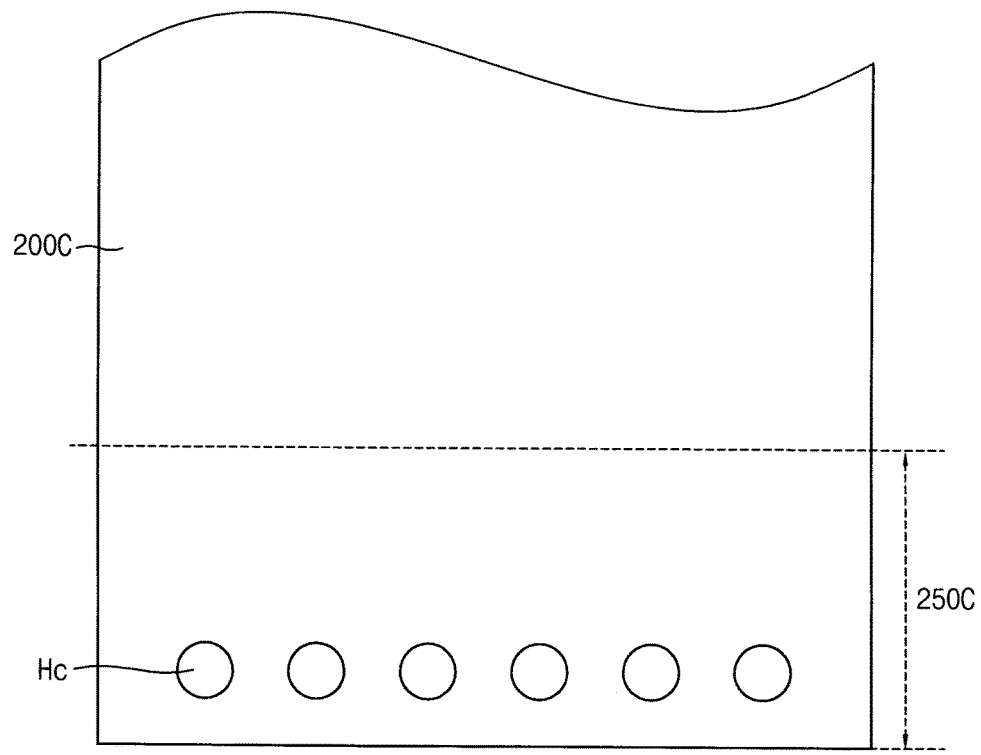

Referring to FIG. 13, according to an exemplary embodiment, a panel cover member 200C may include a stepped portion 250C in an end area of the panel cover member 200C. The stepped portion 250C may include a plurality of openings Hc having a circular shape and arranged in a row (e.g., a single row).

Figure 14:
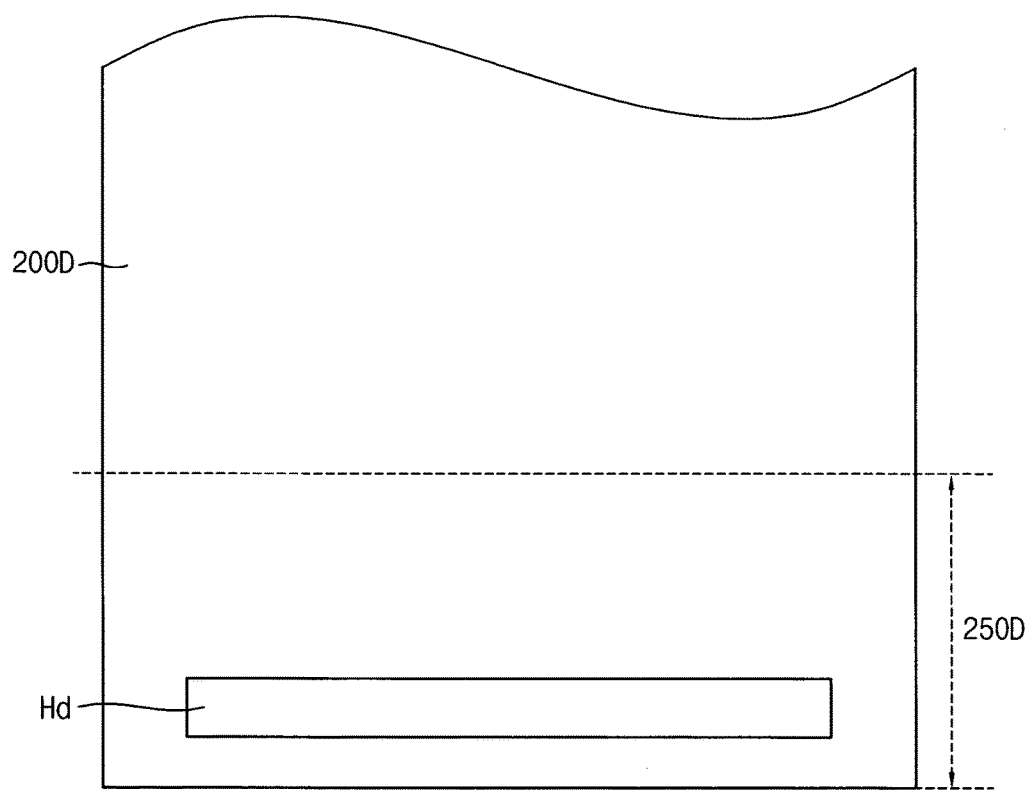

Referring to FIG. 14, according to an exemplary embodiment, a panel cover member 200D may include a stepped portion 250D in an end area of the panel cover member 200D. The stepped portion 250D may include a single opening Hd having a quadrilateral shape.

The opening of the panel cover member is not limited thereto, and may have various shapes and may be variously arranged.

FIG. 15 is a cross-sectional view illustrating a display apparatus according to an exemplary embodiment.

Herein, the same reference numerals are used to refer to the same or like parts as those used in the previously described exemplary embodiment, and any repetitive explanation may be simplified or omitted.

Referring to FIG. 15, a display apparatus 2000 may include a display panel 100, a panel cover member 200E, a stress-reduction member 300E, a flexible circuit board 400, and a printed circuit board 500.

The display panel 100 may include a display area DA and a peripheral area PA surrounding the display area DA in a plan view.

A plurality of pixels may be arranged as a matrix type in the display area DA.

According to an exemplary embodiment, the peripheral area PA may correspond to a side portion of the display area DA in which the flexible circuit board 400 is disposed. The peripheral area PA may include a first area A1, a second area A2, and a bending area BA.

The first area A1 may be adjacent to a side portion of the display area DA, the second area A2 may correspond to an area in which the flexible circuit board 400 is disposed, and the bending area BA may be located between the first and second areas A1 and A2.

The display panel 100 may include a flexible substrate layer 120 and a pixel circuit layer 130 in a cross-sectional view.

The flexible substrate layer 120 may be removed in the bending area BA of the display panel 100 in which the display panel 100 is bent such that a tensile stress of the display panel 100 may be reduced.

In an embodiment, the pixel circuit layer 130 may include a circuit layer which includes a plurality of transistors, a plurality of capacitors, and a plurality of signal lines, and an OLED layer which includes a plurality of organic light emitting diodes on the circuit layer.

The panel cover member 200E may be disposed in the display area DA and the first area A1 of the display panel 100.

The panel cover member 200E may be a polarizing film or a touch sensing panel, but is not limited thereto. For example, the panel cover member 200E may be any of various cover members covering a side surface of the display panel 100.

The stress-reduction member 300E may be disposed in the first area A1, the bending area BA, and the second area A2 of the peripheral area PA. The stress-reduction member 300E may be disposed under the panel cover member 200E in the first area A1 of the display panel 100 and, thus, may overlap with an end area of the panel cover member 200E. The stress-reduction member 300E may be disposed on an end area of the flexible circuit board 400 which is disposed in the second area A2 of the display panel 100 and, thus, may overlap with the end area of the flexible circuit board 400.

An end area of the stress-reduction member 300E may be covered by the end area of the panel cover member 200E. A tensile stress of the stress-reduction member 300E may be dispersed to the panel cover member 200E. Therefore, damage such as a peeling interface between the display panel 100 and the stress-reduction member 300E may be avoided.

The flexible circuit board 400 may be disposed in the second area A2 of the display panel 100. In an embodiment, a first end area of the flexible circuit board 400 may be adhered to the second area A2 of the display panel 100 through an anisotropic conductive film (ACF) 410.

The printed circuit board 500 may be connected to the flexible circuit board 400. In an embodiment, a second end area of the flexible circuit board 400 may be adhered to the printed circuit board 500 through the anisotropic conductive film (ACF) 410.

FIG. 16 is a cross-sectional view illustrating a display apparatus according to an exemplary embodiment.

Referring to FIG. 16, a display apparatus 3000 may include a display panel 100, a panel cover member 200F, a flexible circuit board 400 and a printed circuit board 500.

The same reference numerals are used to refer to the same or like parts as those described in the previous exemplary embodiment, and any repetitive explanation may be simplified or omitted.

According to an exemplary embodiment, the display apparatus 3000 may omit a stress-reduction member which is disposed in the bending area in comparison with the display apparatus 1000 according to the exemplary embodiment described above.

The display apparatus 3000 may include the panel cover member 200F. The panel cover member 200F may be generally adhered to the display panel 100 that includes a display area DA, a first area A1, a bending area BA, and a second area A2.

As shown in FIG. 16, the panel cover member 200F may be adhered from the display area DA to an end area of the flexible circuit board 400 which is disposed in the second area A2 of the display panel 100. In an embodiment, the panel cover member 200F may be a polarizing film. Alternatively, the panel cover member 200F may be a touch sensing panel, but is not limited thereto. For example, the panel cover member 200F may be any of various cover members covering a side surface of the display panel 100.

According to an exemplary embodiment, the panel cover member 200F may perform a function of the stress-reduction member according to the previously described exemplary embodiment.

The panel cover member 200F adhered to the display area DA may be extended and adhered to the first area A1, the bending area BA, and the second area A2 of the display panel 100 and, thus, a tensile stress of the bending area BA may be generally dispersed to the panel cover member 200F.

In comparison with the previously described exemplary embodiment, one or more processes for forming the stress-reduction member may be omitted and thus a manufacturing process may be simplified.

According to one or more exemplary embodiments, the end area of the panel cover member which is disposed on a side surface of the display panel may overlap with the end area of the stress-reduction member which is disposed in the bending area of the display panel. Therefore, the tensile stress of the bending area may be reduced and damage, such as a peeling interface between the display panel and the stress-reduction member, may be avoided.

In addition, the panel cover member may be extended and adhered from the display area to the peripheral area of the display panel and thus, the tensile stress of the bending area may be reduced.

The present inventive concept may be applied to a display device and an electronic device having the display device. For example, the present inventive concept may be applied to a computer monitor, a laptop, a digital camera, a cellular phone, a smart phone, a smart pad, a television, a personal digital assistant (PDA), a portable multimedia player (PMP), an MP3 player, a navigation system, a game console, a video phone, etc.

The foregoing is illustrative of the inventive concept and is not to be construed as limiting thereof. Although some exemplary embodiments of the inventive concept have been described, those skilled in the art will readily appreciate that many modifications are possible in the exemplary embodiments without materially departing from the novel teachings and aspects of the inventive concept. Accordingly, all such modifications are intended to be included within the scope of the inventive concept as defined in the claims. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. A display apparatus comprising:
    a display panel comprising a display area in which a plurality of pixels is arranged, and a peripheral area surrounding the display area;
    a panel cover member covering the display area and a first area of the peripheral area adjacent to the display area and including at least one opening corresponding to the first area; and
    a stress-reduction member overlapping with an end area of the panel cover member which is arranged in the first area, the stress-reduction member inserted in the at least one opening and arranged in a bending area of the peripheral area in which the display panel is bent.

2. The display apparatus of claim 1, wherein the panel cover member comprises a polarizing film.

3. The display apparatus of claim 1, wherein the panel cover member comprises a touch sensing panel.

4. The display apparatus of claim 1,
    wherein the panel cover member comprises a stepped portion at the end area thereof, the stepped portion defining a spacing by which the panel cover member is spaced apart from the display panel,
    wherein the at least one opening is arranged in the stepped portion of the panel cover member, and
    wherein the stress-reduction member is inserted in the spacing.

5. The display apparatus of claim 1,
    wherein the peripheral area of the display panel comprises a second area in which a flexible circuit board is arranged, and wherein the stress-reduction member covers an end area of the flexible circuit board.

6. The display apparatus of claim 1,
wherein the display panel comprises a flexible substrate layer and a pixel circuit layer on the flexible substrate layer,
wherein the pixel circuit layer comprises a plurality of transistors, a plurality of signal lines, and a plurality of organic light emitting diodes, and
wherein the flexible substrate layer is not present in the bending area of the display panel.

7. The display apparatus of claim 1, wherein the at least one opening comprises a plurality of openings arranged as a matrix type which comprises a plurality of rows and a plurality of columns.

8. The display apparatus of claim 7, wherein the at least one opening has a circular shape.

9. The display apparatus of claim 7, wherein the at least one opening has a quadrilateral shape.

10. A display apparatus comprising:
a display panel comprising a display area in which a plurality of pixels is arranged, and a peripheral area surrounding the display area;
a panel cover member covering the display area and a first area of the peripheral area adjacent to the display area; and
a stress-reduction member overlapping with an end area of the panel cover member which is arranged in the first area, the stress-reduction member arranged in a bending area of the peripheral area in which the display panel is bent,
wherein the panel cover member comprises a stepped portion at the end area thereof, the stepped portion defining a spacing by which the panel cover member is spaced apart from the display panel, the stress-reduction member inserted in the spacing.

* * * * *